United States Patent
Kadota

(10) Patent No.: US 8,376,012 B2
(45) Date of Patent: Feb. 19, 2013

(54) COMPONENT PRESS-BONDING APPARATUS AND COMPONENT PRESS-BONDING METHOD

(75) Inventor: Syozo Kadota, Yamanashi (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/513,929

(22) PCT Filed: Dec. 3, 2010

(86) PCT No.: PCT/JP2010/007050
§ 371 (c)(1),
(2), (4) Date: Jun. 5, 2012

(87) PCT Pub. No.: WO2011/070753
PCT Pub. Date: Jun. 16, 2011

(65) Prior Publication Data
US 2012/0241072 A1    Sep. 27, 2012

(30) Foreign Application Priority Data
Dec. 7, 2009 (JP) .................................. 2009-277679

(51) Int. Cl.
*B32B 38/18* (2006.01)
(52) U.S. Cl. ........... 156/361; 156/60; 156/538; 156/543
(58) Field of Classification Search ............. 156/60, 156/361, 538, 539, 543, 553
See application file for complete search history.

(56) References Cited

U.S. PATENT DOCUMENTS

| 7,490,652 B2 * | 2/2009 | Minamitani et al. ........... 156/539 |
| 7,875,138 B2 * | 1/2011 | Yamada et al. .................. 156/64 |

FOREIGN PATENT DOCUMENTS

| JP | 3279853 | 4/2002 |
| JP | 2007-165571 | 6/2007 |
| JP | 2008-159880 | 7/2008 |

OTHER PUBLICATIONS

International Preliminary Report on Patentability issued Jul. 5, 2012 in International (PCT) Application No. PCT/JP2010/007050.

* cited by examiner

*Primary Examiner* — Katarzyna Wyrozebski Lee
*Assistant Examiner* — John Blades
(74) *Attorney, Agent, or Firm* — Wenderoth, Lind & Ponack, L.L.P.

(57) ABSTRACT

In a component press-bonding apparatus including a press-bonding tool for press-bonding a component, which is placed on a panel, to the panel via a sheet, the press-bonding tool is provided so as to be movable in a first direction (X-axis direction) orthogonal to a press-bonding direction. The component press-bonding apparatus has a sheet conveyance unit comprising: a feed reel which feeds a sheet in a second direction (Y-axis direction) orthogonal to the press-bonding direction and the first direction and which is movable in the first direction; a path member which forms a sheet path extending from the feed reel in the second direction and reaching the press-bonding tool and which is movable in the first direction; and a feed roller for feeding the sheet in the second direction. The feed roller is removably fitted to the sheet conveyance unit.

9 Claims, 9 Drawing Sheets

COMPONENT PRESS-BONDING APPARATUS AND COMPONENT PRESS-BONDING METHOD

TECHNICAL FIELD

The present invention relates to a component press-bonding apparatus and a component press-bonding method for press-bonding components onto a display panel such as plasma display devices, liquid crystal display devices, and organic EL (Electro-Luminescence) displays.

BACKGROUND ART

Conventionally, for press bonding of components onto a display panel with intervention of an ACF (Anisotropic Conductive Film), there has been used a press-bonding tool that presses a component against the display panel. In press-bonding, a protective sheet is placed between the press-bonding tool and the component. This protective sheet serves to prevent adhesion of the ACF to the press-bonding tool.

Such a protective sheet gets increasingly contaminated by adhesion of part of the ACF each time components are press-bonded to the display panel by a press-bonding tool, and therefore needs to be replaced with contamination-free new protective sheet as required.

For example, in cases of component press-bonding apparatuses described in PTLs 1 and 2, the protective sheet is wound on a feed reel. The protective sheet drawn out from the feed reel is wound up on a wind-up reel finally. A portion of the protective sheet between the two reels is set between the press-bonding tool and the component. As the press bonding of the component to the display panel is done to a specified number of times, the protective sheet is fed by a specified quantity from the feed reel side to the wind-up reel side so that the contamination-free portion is set between the press-bonding tool and the component. In addition, in the component press-bonding apparatus described in PTL 1, a plurality of types of protective sheets are set between the press-bonding tool and the component.

CITATION LIST

Patent Literature

PTL1: JP 2007-165571 A
PTL2: JP 3279853 B

SUMMARY OF INVENTION

Technical Problem

In recent years, as display panels have been getting larger-scaled, the number of components to be press-bonded to one display panel have resultantly been increasing. Correspondingly, the number of press-bonding tools of a component press-bonding apparatus has also been increasing. For multiple press-bonding tools, two methods may be available for protecting the multiple press-bonding tools by protective sheet.

A first method may be to fulfill the protection of multiple press-bonding tools with one protective sheet. In this case, however, out of one protective sheet, regions of the protective sheet positioned between the multiple press-bonding tools are not effectively used for the protection of the press-bonding tools.

A second method may be to use one protective sheet for each of multiple press-bonding tools. In this case, individual protective sheets are used more effectively for protection of individual press-bonding tools, as compared with the first method. However, members and mechanisms to be used for conveyance of the protective sheet such as the feed reel and the wind-up reel are needed for each press-bonding tool. Also, in the case where the component press-bonding apparatus is made up so as to be ready for changes in the number of components fitted to the display panel and/or changes in component press-bonding sites on the display panel, it is necessary that positions of the feed reel, the wind-up reel and the like, i.e. a conveyance path for the protective sheet, be changeable. As a result, the conveyance mechanism for the protective sheet becomes complex, so that the fitting of the protective sheet to the conveyance mechanism becomes difficult to do.

Accordingly, an object of the present invention is to allow effective use of the protective sheet for protection of press-bonding tools, allow changeability of the conveyance path of protective sheet and allow easier fitting of the protective sheet to the conveyance path.

Solution to Problem

In order to achieve the object, the invention is configured as follows.

According to a first aspect of the invention, there is provided a component press-bonding apparatus including a press-bonding tool for press-bonding a component, which is placed on a panel, to the panel via a sheet, wherein the press-bonding tool is provided so as to be movable in a first direction orthogonal to a press-bonding direction, and the component press-bonding apparatus has a sheet conveyance unit comprising:

a feed reel which feeds a sheet in a second direction orthogonal to the press-bonding direction and the first direction and which is movable in the first direction;

a path member which forms a sheet path extending from the feed reel in the second direction and reaching the press-bonding tool and which is movable in the first direction; and a feed roller for feeding the sheet in the second direction, and wherein the feed roller is removably fitted to the sheet conveyance unit.

According to a second aspect of the invention, there is provided the component press-bonding apparatus according to the first aspect of the invention, wherein the press-bonding tool is provided in plurality and the press-bonding tools are arrayed in the first direction, the sheet conveyance unit has the feed reels and the path members both counting equal in number to the press-bonding tools, and the feed roller is so structured as to extend in the first direction and feed a plurality of sheets simultaneously in the second direction.

According to a third aspect of the invention, there is provided the component press-bonding apparatus according to the first aspect of the invention, wherein the path member has two rollers for supporting the sheet on one surface of the sheet, the feed roller, when fitted to the sheet conveyance unit, is placed by being moved between the two rollers of the path member while keeping in contact with the other surface of the sheet.

According to a fourth aspect of the invention, there is provided the component press-bonding apparatus according to the first aspect of the invention, further comprising a sheet driving unit which includes the feed roller and an entrainment-preventing member for preventing entrainment of the sheet to the feed roller and which is removably fitted to the sheet conveyance unit.

According to a fifth aspect of the invention, there is provided the component press-bonding apparatus according to the first aspect of the invention, wherein the path member has a pinch roller which can bias the sheet toward the feed roller and which can go separate from the feed roller.

According to a sixth aspect of the invention, there is provided the component press-bonding apparatus according to the first aspect of the invention, further comprising a guide member which serves for positioning and guiding the sheet moved from feed reel in the first direction and which is movable in the first direction.

According to a seventh aspect of the invention, there is provided the component press-bonding apparatus according to the first aspect of the invention, further comprising:

a contact member which is contactable with the sheet; and a swinging lever which swings on a center of a pivot extending in the first direction and supports the contact member by its free end, and which, by swinging, makes the sheet approach a component via the contact member.

According to a eighth aspect of the invention, there is provided the component press-bonding apparatus according to the first aspect of the invention, further comprising:

sheet conveyance units provided for individual types of sheets so that a plurality of sheets of at least one type can be placed between the press-bonding tool and a component in a state of being stacked in the press-bonding direction; and a sheet recovery box which has at least one or more housing spaces enabled to independently house a plurality of sheets of at least one type having passed through between the press-bonding tool and the component and which is rotatably supported by the sheet conveyance unit, wherein the sheet recovery box is enabled to, when rotating, dispose the sheets housed in the individual housing spaces simultaneously.

According to a ninth aspect of the invention, there is provided a component press-bonding method in which a component placed on a panel is press-bonded to the panel by a press-bonding tool via a sheet, the method comprising:

aligning the press-bonding tool to a position in a first direction orthogonal to a press-bonding direction so that the component is present in the press-bonding direction of the press-bonding tool;

aligning a feed reel in such a way that the sheet can be fed in a second direction orthogonal to the press-bonding direction and the first direction and moreover the position in the first direction becomes equal in position in the first direction to the press-bonding tool; and feeding the sheet of the feed reel in the second direction toward the press-bonding tool by a feed roller, wherein the feed roller is fitted so as to be removable from a support member supporting the feed roller.

According to a tenth aspect of the present invention, there is provided the component press-bonding method according to the ninth aspect of the invention, wherein the press-bonding tool is provided in plurality and the press-bonding tools are arrayed in the first direction, the feed reels are provided equal in number to the press-bonding tools, and the feed roller is so structured as to extend in the first direction and feed a plurality of sheets simultaneously in the second direction.

Advantageous Effects of Invention

According to the present invention, since one sheet is used for one press-bonding tool, the sheet is used effectively for protection of the press-bonding tool. Therefore, in cases where a plurality of press-bonding tools are provided, one sheet is used for each press-bonding tool, so that the individual sheets are used effectively for protection of their corresponding press-bonding tools.

Also, only changing first-direction positions of the press-bonding tools, the feed reels, and the path members allows the sheet conveyance paths to be changed in correspondence to changes in the first direction of the components placed on the panel.

Further, since the feed roller for feeding the sheets is removably fittable to the sheet conveyance unit, the sheets for the feed reels can be fitted to the conveyance paths and the feed roller with simplicity, as compared with cases in which the feed roller is not removably fittable.

BRIEF DESCRIPTION OF DRAWINGS

The above aspects and features of the present invention will become more apparent from the following description of preferred embodiments thereof with reference to the accompanying drawings, and wherein.

DESCRIPTION OF EMBODIMENTS

Figure 1:
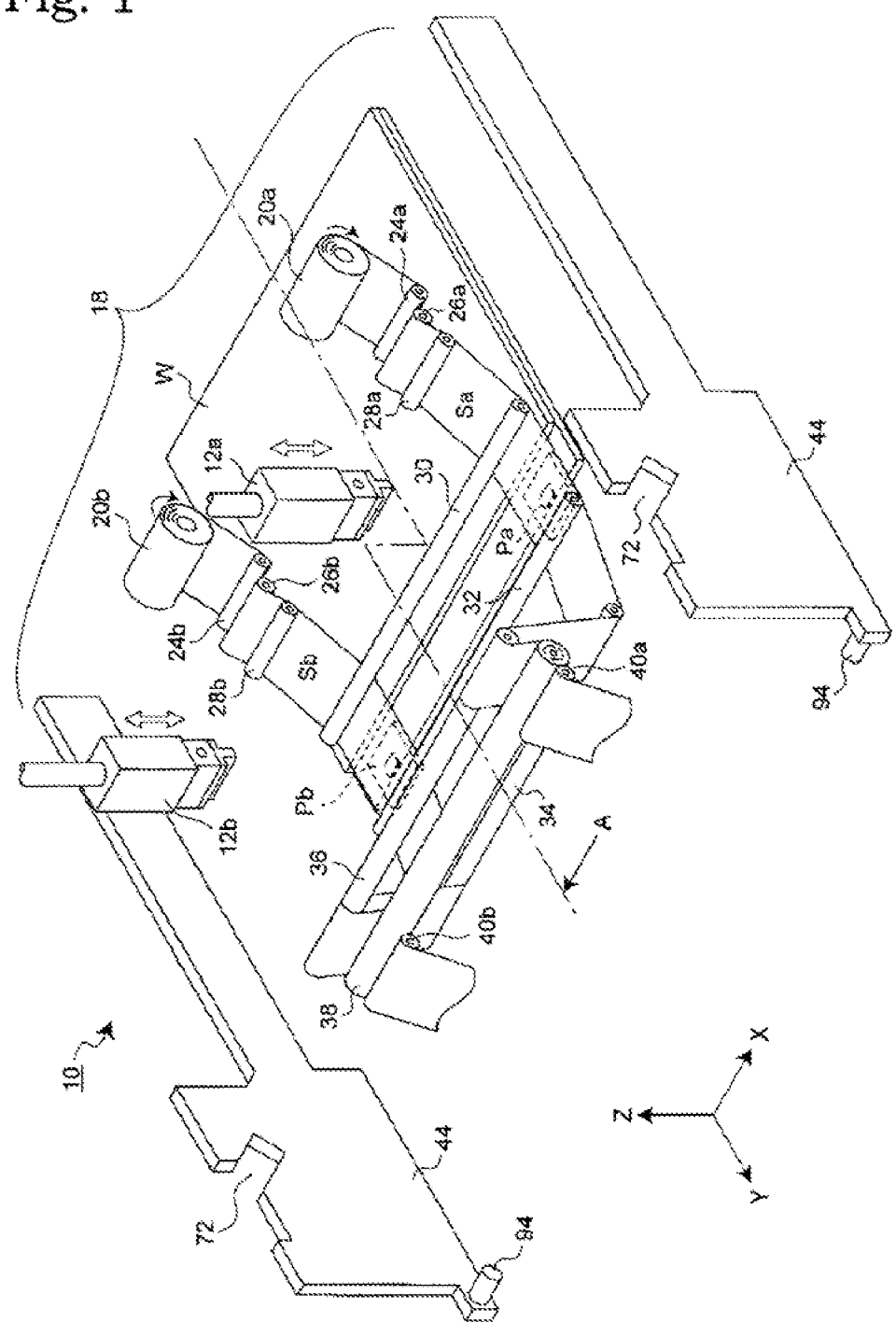
FIG. 1 is a perspective view conceptually showing a component press-bonding apparatus according to an embodiment of the present invention.
Figure 2:
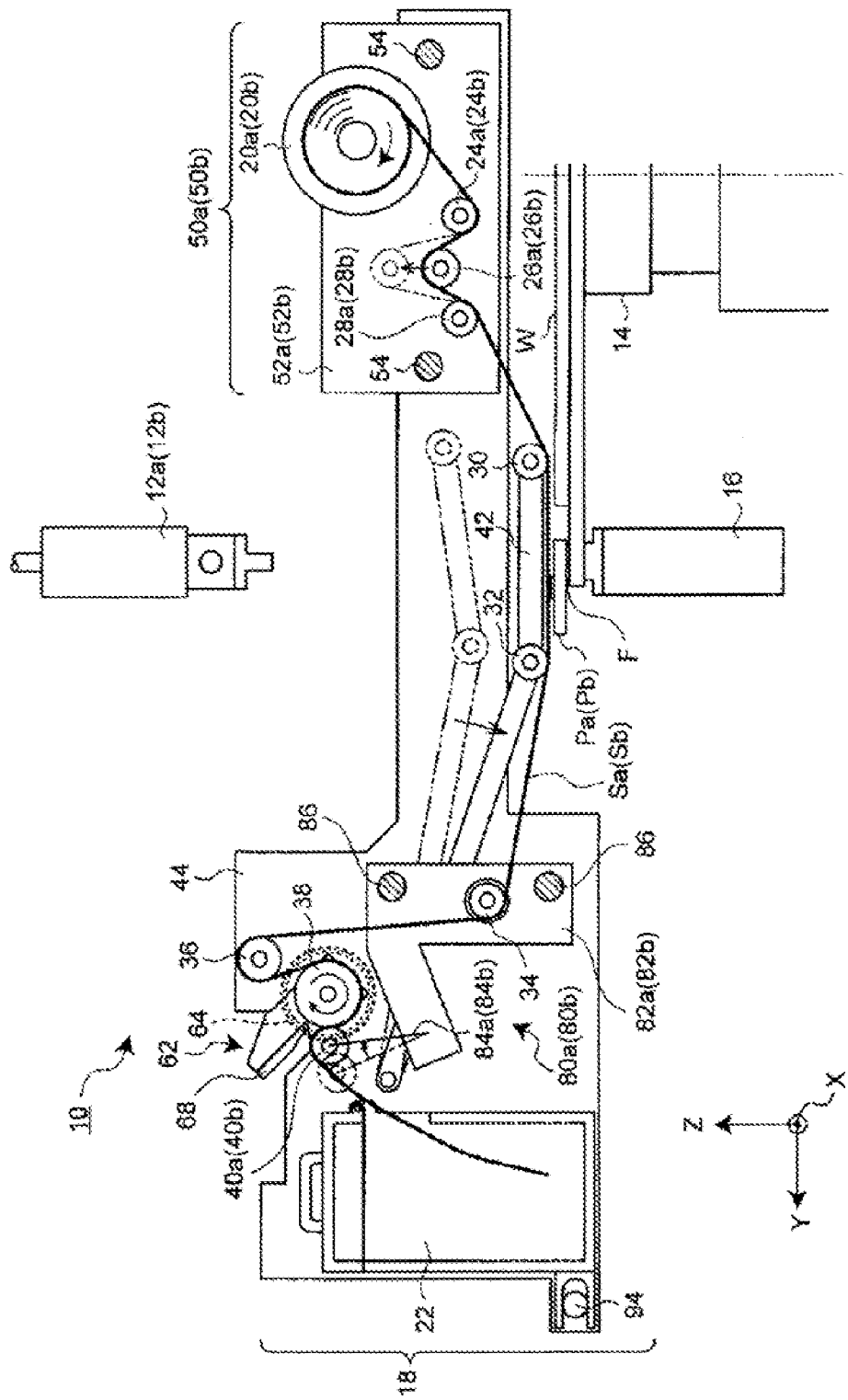
FIG. 2 is a side sectional view of the component press-bonding apparatus according to an embodiment of the invention (as viewed in a direction of arrow A in FIG. 1)

FIG. 1 is a perspective view conceptually showing a component press-bonding apparatus according to an embodiment of the present invention for executing component press-bonding. FIG. 2 is a schematic side sectional view of the component press-bonding apparatus denoted by reference numeral 10 in FIG. 1.

As shown in FIGS. 1 and 2, this component press-bonding apparatus 10 is so constructed as to press-bond a plurality of components Pa, Pb onto a display panel (hereinafter, referred to as 'panel') W of a plasma display device, a liquid crystal display device or the like with ACF F interposed therebetween in a state that the components Pa, Pb are juxtaposed in side edge portions of the panel W along a longitudinal direction (which is an X-axis direction in the figure and the first direction described in Claims) of the side edge portions of the panel W.

In addition, although two components Pa, Pb are shown in FIG. 1, yet the invention is not limited to two. The invention is so designed that at least one component is press-bonded to a display panel.

As shown in FIG. 2, the component press-bonding apparatus 10 includes: a plurality of press-bonding tools 12a, 12b up-and-down movable in a press-bonding direction, which is a direction of press-bonding of the components Pa, Pb to the panel W via protective sheets Sa, Sb (i.e., movable in a Z-axis direction orthogonal to the X-axis direction); a table 14 for supporting the panel W at its central portion; an up-and-down movable backup stage 16 which is placed below the press-bonding tools 12a, 12b and which supports side edge portions of the panel W; and a protective sheet cassette 18 which is placed between the press-bonding tools 12a, 12b and the panel W and in which the tape-like protective sheets Sa, Sb for protecting the press-bonding tools 12a, 12b are housed.

The plurality of press-bonding tools 12a, 12b, which press and bond corresponding components Pa, Pb to the panel W, are made up so as to be manually or automatically movable in the X-axis direction orthogonal to the Z-axis direction that is the press-bonding direction. As a result, in a case where press-bonding positions in the X-axis direction of the plurality of components Pa, Pb are changed, e.g., where specifications of the panel W are changed, the plurality of press-bonding tools 12a, 12b are enabled to press the components Pa, Pb against the panel W.

The table 14 is a table for supporting the panel W at its central portion. In a case where components are press-bonded each of plural side edge portions of the panel W, the table 14 is provided as a turntable that rotates about the Z axis as a center.

The backup stage 16 is placed below the plurality of press-bonding tools 12a, 12b and made up-and-down movable. The backup stage 16 is moved up to come into contact with rear sides of the side edge portions of the panel W overall in the Y-axis direction, thereby supporting the side edge portions.

The protective sheet cassette 18 is a cassette for housing a protective sheet Sa set between the press-bonding tool 12a and the component Pa, and a protective sheet Sb set between the press-bonding tool 12b and the component Pb. In this embodiment, the protective sheet cassette 18 is provided fittable to and removable from the component press-bonding apparatus 10. Details of the protective sheet cassette 18 will be described later.

A procedure for press-bonding of the components Pa, Pb to the panel W is briefly explained.

First, a plurality of components Pa, Pb are placed at specified component press-bonding sites in the side edge portions of the panel W, respectively with an ACF F interposed therebetween. Next, the panel W with the plurality of components Pa, Pb set thereon is placed onto the table 14 so that the components Pa, Pb are positioned correspondingly below the press-bonding tools 12a, 12b, respectively.

Subsequently, the backup stage 16 is moved up and/or the table 14 with the panel W set thereon is moved down so as to support the side edge portions of the panel W from below (see FIG. 2). Then, the press-bonding tool 12a is moved clown to press the component Pa toward the panel W via the protective sheet Sa. Simultaneously with this, the press-bonding tool 12b is moved down and presses the component Pb toward the panel W via the protective sheet Sb. As a result, the components Pa, Pb are press-bonded to the panel W. In this press-bonding operation, the press-bonding tool 12a is protected by the protective sheet Sa while the press-bonding tool 12b is protected by the protective sheet Sb.

Now, details of the protective sheet cassette 18 are described. The protective sheet cassette 18, which is a unit for conveying the protective sheet, has feed reels 20a, 20b for feeding the protective sheets Sa, Sb, and a recovery box 22 for recovering the protective sheets Sa, Sb which used for protection of the press-bonding tools 12a, 12b when the press-bonding. The protective sheet cassette 18 is so designed as to convey the protective sheets Sa, Sb from the feed reels 20a, 20b toward the recovery box 22.

More specifically, as shown in FIGS. 1 and 2, the protective sheet cassette 18 convey the protective sheets Sa, Sb of an X-axis-direction paralleled state in the Y-axis direction (which is a direction orthogonal to the X-axis and Z-axis directions and which is the second direction as defined in Claims). For this purpose, the protective sheet cassette 18 holds a plurality of feed reels 20a, 20b rotatable and moreover has a plurality of rollers 24-40 as path members for forming paths for a plurality of sheets Sa, Sb.

The rollers 24a, 28a, which are guide rollers for the protective sheet Sa, are in contact with the bottom side (contact side with the press-bonding tool 12a) of the protective sheet Sa.

The rollers 24b, 28b, which are guide rollers for the protective sheet Sb, are in contact with the bottom side (contact side with the press-bonding tool 12b) of the protective sheet Sb.

The roller 26a, which is a tension roller for giving a tension to the protective sheet Sa, is placed between the two guide rollers 24a, 28a on the path of the protective sheet Sa. Also, the tension roller 26a is in contact with the top side (contact side with the component Pa) of the protective sheet Sa, and moreover biased by a spring (not shown) or the like so as to raise the protective sheet Sa.

The roller 26b, which is a tension roller for giving a tension to the protective sheet Sb, is placed between the two guide rollers 24b, 28b on the path of the protective sheet Sb. Also, the tension roller 26b is in contact with the top side (contact side with the component Pb) of the protective sheet Sb, and moreover biased by a spring (not shown) or the like so as to raise the protective sheet Sb.

The rollers 30, 32, which are guide rollers to be used in common to the protective sheets Sa, Sb as shown in FIG. 1, are in contact with the bottom side of the protective sheets Sa, Sb. Also, the rollers 30, 32 are supported at their both ends by a pair of swinging levers 42 as shown in FIG. 2. Details of the swinging levers 42 will be described later.

The roller 34, which is a guide roller to be used in common to the protective sheets Sa, Sb as shown in FIG. 1, are in contact with the bottom side of the protective sheets Sa, Sb. Also, the roller 34 is supported at their both ends by a pair of side wall members 44 forming a housing for the protective sheet cassette 18.

The roller 36, which is a guide roller to be used in common to the protective sheets Sa, Sb, is in contact with the top side of the protective sheets Sa, Sb. Also, the roller 36 is supported at its both ends by the pair of side wall members 44.

The common feed roller 38 is a common feed roller on which itself a plurality of protective sheets Sa, Sb are wound (where, for example, a winding angle θ, which is an angle of contact between the protective sheets Sa, Sb and the common feed roller 38, is 180-270°; the more the winding angle is large, the more the protective sheets Sa, Sb can be fed stably), and which feeds the wound-on protective sheets Sa, Sb simultaneously in the Y-axis direction, the feed roller extending in the X-axis direction so as to be in contact with the bottom side of both protective sheets Sa, Sb. Also, the common feed roller 38 is rotated by a drive source such as a motor or a cylinder. Details of the common feed roller 38 will be described later.

The pinch roller 40a, which is a pinch roller for pressing the protective sheet Sa against the common feed roller 38, is in contact with the top side of the protective sheet Sa. Also, the pinch roller 40b, which is a pinch roller for pressing the protective sheet Sb against the common feed roller 38, is in contact with the top side of the protective sheet Sb. These pinch rollers 40a, 40b are enabled to bias the corresponding protective sheets toward the common feed roller 38 independently, respectively, and moreover to come off from the common feed roller 38. Details of the pinch rollers 40a, 40b will be described later.

As shown in FIG. 2, the feed reel 20a, the guide rollers 24a, 28a and the tension roller 26a constitute a reel unit 50a. More specifically, the reel unit 50a has a pair of side wall members 52a. The pair of side wall members 52a, which are plate-shaped members, rotatably support therebetween the feed reel 20a, the guide rollers 24a, 28a and the tension roller 26a at their both ends, respectively. The feed reel 20a is removably supported by the pair of side wall members 52a so as to be replaceable with another. The tension roller 26a is supported by the pair of side wall members 52a so as to be movable in the Z-axis direction.

Similarly, the feed reel 20b, the guide rollers 24b, 28b and the tension roller 26b constitute a reel unit 50b. More specifically, the reel unit 50b has a pair of side wall members 52b. The pair of side wall members 52b, which are plate-shaped members, rotatably support therebetween the feed reel 20b, the guide rollers 24b, 28b and the tension roller 26b at their both ends, respectively. The feed reel 20b is removably supported by the pair of side wall members 52b so as to be replaceable with another. The tension roller 26b is supported by the pair of side wall members 52b so as to be movable in the Z-axis direction.

These reel units 50a, 50b are supported by a pair of side wall members 44 of the protective sheet cassette 18 so as to be movable in the X-axis direction. More specifically, the reel units 50a, 50b are supported by a plurality of guide rods 54 extending in the X-axis direction and having both ends supported by the pair of side wall members 44. The plurality of guide rods 54, which extend through a pair of side wall members 52a, 52b of the reel units 50a, 50b, guide the pair of side wall members 52a, 52b slidably in the X-axis direction.

By the reel units 50a, 50b as described above, the protective sheets Sa, Sb can be changed in their positions in the X-axis direction. As a result, when X-axis direction press-bonding positions of a plurality of components Pa, Pb are changed, e.g., when specifications of the panel W are changed, the protective sheets Sa, Sb can be placed above their corresponding components Pa, Pb, respectively.

Figure 3:
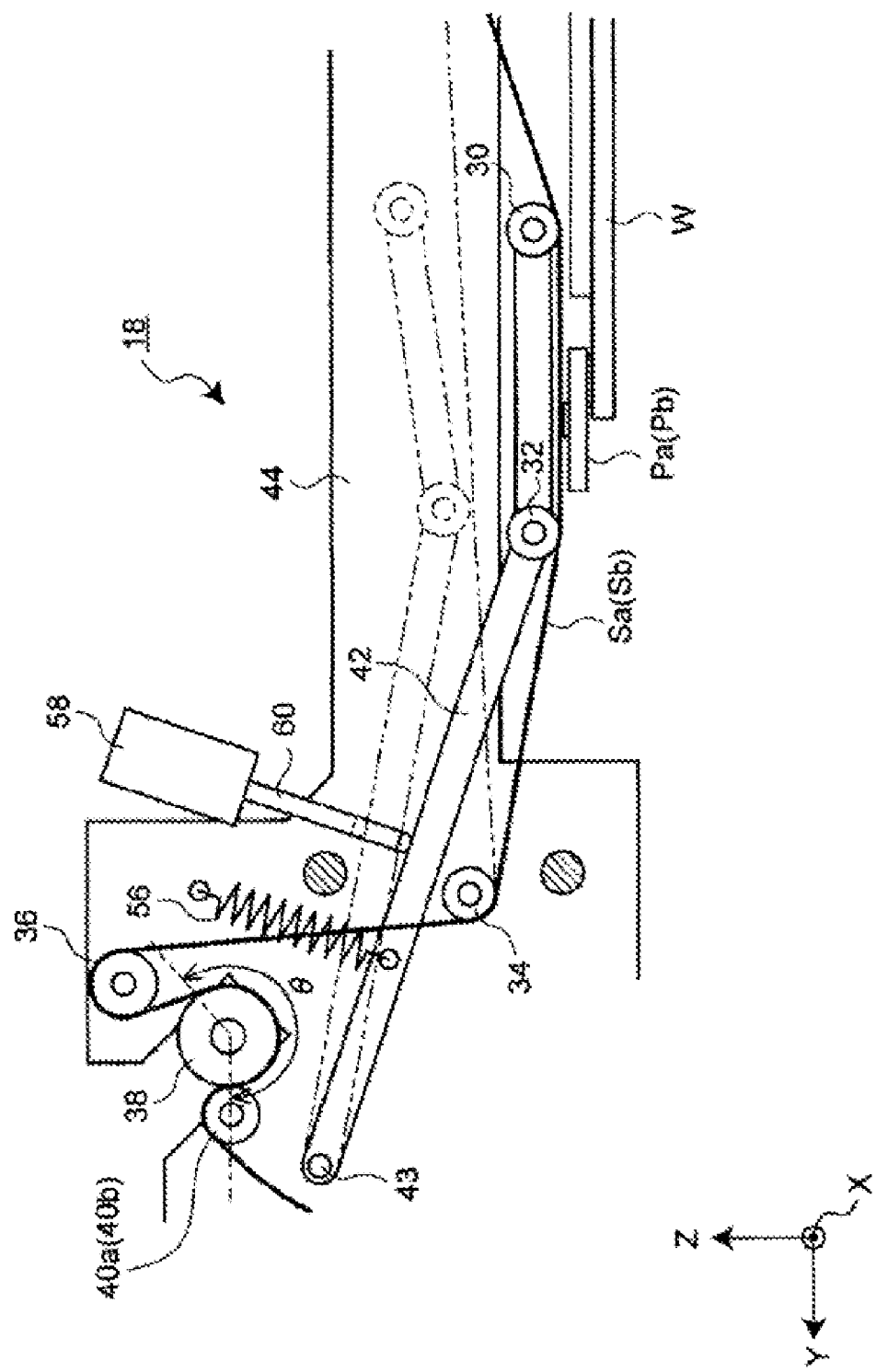
FIG. 3 is a side sectional view of a swinging lever of the component press-bonding apparatus according to an embodiment of the invention (as viewed in the direction of arrow A in FIG. 1)

A pair of swinging levers 42, as shown in FIG. 3, is supported swingably like a cantilever by the pair of side wall members 44 of the protective sheet cassette 18 along inner side faces of the side wall members 44 on a center of a common support shaft 43 extending in the X-axis direction. Also, the pair of swinging levers 42 support two guide rollers 30, 32 by their free ends separate from the common support shaft 43. Further, the pair of swinging levers 42 are biased by springs 56 in such a direction that the two guide rollers 30, 32 go away from the components Pa, Pb.

Cylinders 58 for swinging the pair of swinging levers 42 are provided in the component press-bonding apparatus 10. More specifically, the cylinders 58 are provided at such positions in the component press-bonding apparatus 10 that when the protective sheet cassette 18 is set to the component press-bonding apparatus 10, their piston rods 60 are enabled to press the swinging levers 42. The piston rods 60 of the cylinders 58, when moving ahead, downwardly press portions of the swinging levers 42 closer to the swinging-center support shaft 43 than portions of the swinging levers 42 supporting the two guide rollers 30, 32.

With use of the pair of swinging levers 42 as described above, only pressing of the pair of swinging levers 42 with a small stroke of the piston rods 60 of the pair of cylinders 58 allows the two guide rollers 30, 32 to be moved to large extents. As a result, the two guide rollers 30, 32 can be brought into contact with the protective sheets Sa, Sb, so that the protective sheets Sa, Sb can be made closer to the components Pa, Pb on the side edge portions of the panel W by the guide rollers 30, 32. Also, when the protective sheet cassette 18 can be is taken out from the component press-bonding apparatus 10, the two guide rollers 30, 32 (sheets Sa, Sb stretched on these rollers) can be made largely separate from the components.

Figure 4:
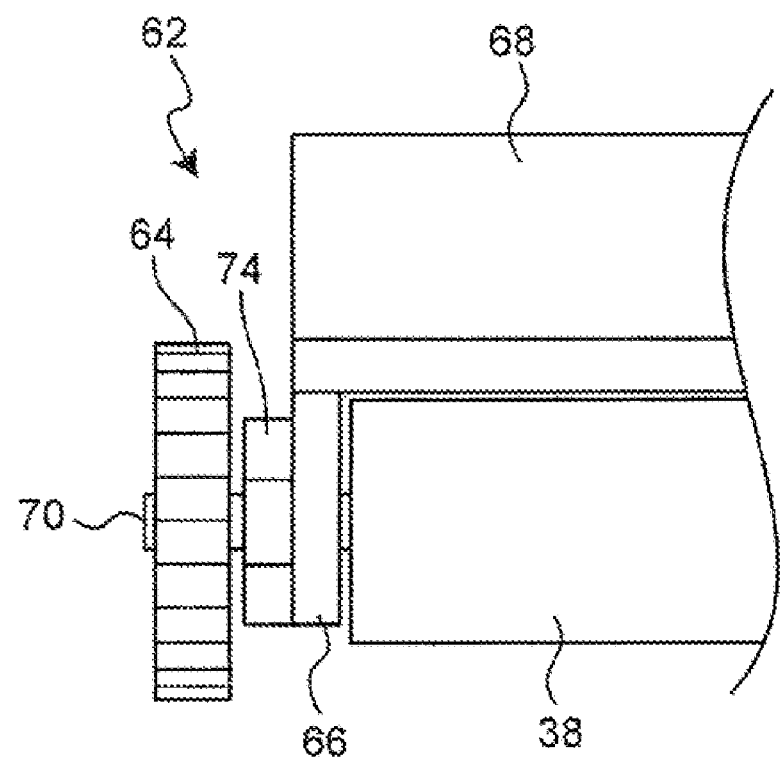
FIG. 4 is a partial plan view of a sheet driving unit of the component press-bonding apparatus according to an embodiment of the invention.

The common feed roller 38, as shown in FIGS. 2 and 4, is incorporated into a sheet driving unit 62. The sheet driving unit 62, which has the common feed roller 38, a gear 64, a unit frame 66 and an entrainment-preventing member 68, is so made up as to be removably fittable to pair of side wall members 44 of the protective sheet cassette 18. It is noted that reasons why the sheet driving unit 62 (common feed roller 38) is made removably fittable to the protective sheet cassette 18 will be described later.

Figure 5:
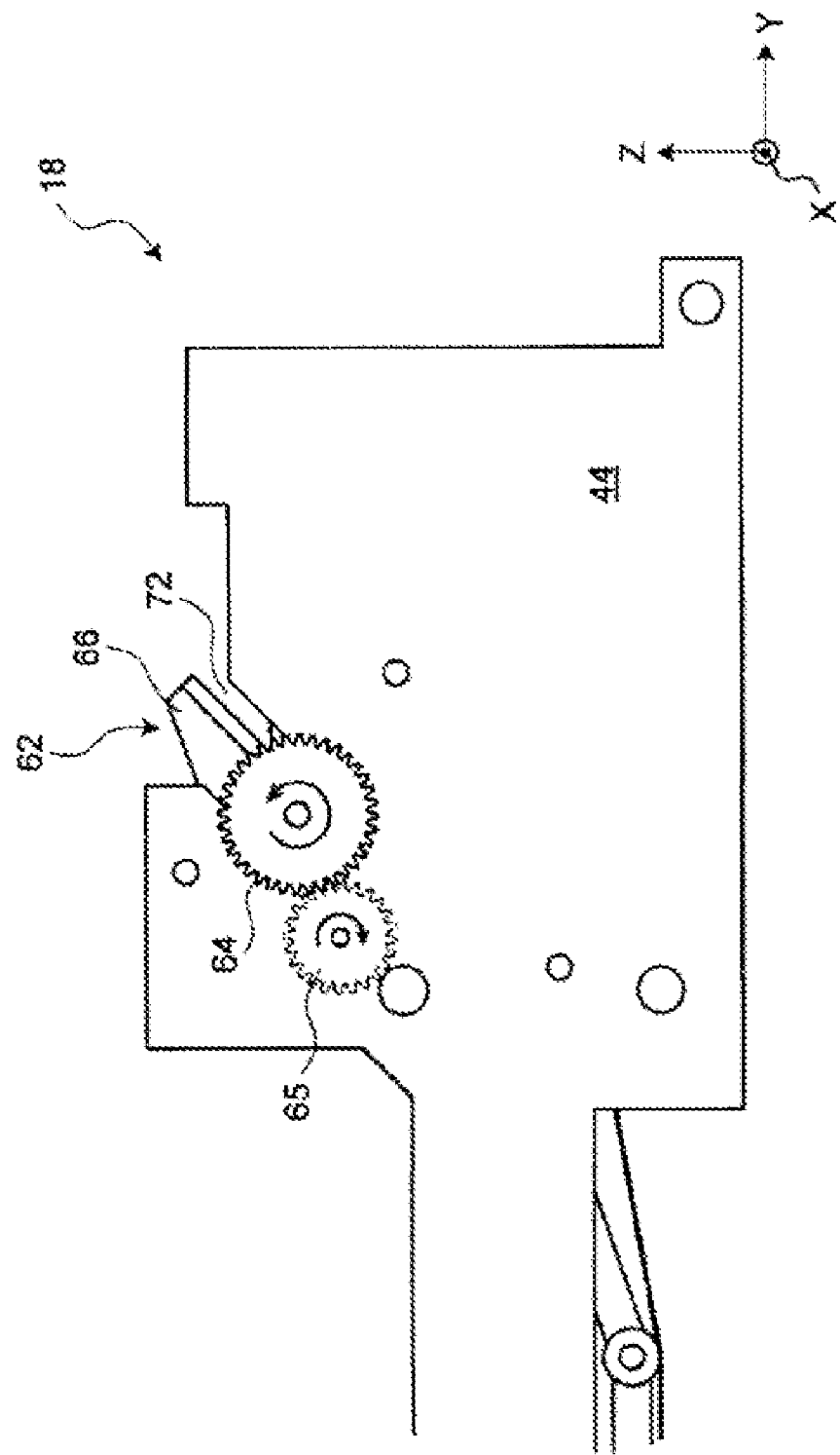
FIG. 5 is a side view showing an aspect of gears in a state that the sheet driving unit shown in FIG. 4 is loaded.

The gear 64 is fixed to both ends or one end of a shaft 70 of the common feed roller 38. Also, when the sheet driving unit 62 is fitted to the pair of side wall members 44 of the protective sheet cassette 18, the gear 64 is positioned outside the side wall members 44 as shown in FIG. 5, in which one side wall member 44 on the protective sheet Sb side is viewed from outside. Also, the gear 64 is to be fittably and removably meshed with a driving gear 65 directly or indirectly coupled to a drive source (not shown) such as a motor or a cylinder-ratchet mechanism provided in the component press-bonding apparatus 10. As the gear 64 is rotated by the driving gear 65, the common feed roller 38 is rotated, so that the plurality of protective sheets Sa, Sb pinched by the pinch rollers 40a, 40b, respectively, and the common feed roller 38 are fed simultaneously. In addition, the driving gear 65 may be provided on either the component press-bonding apparatus 10 side or the protective sheet cassette 18 side, whichever side does not matter, but it is preferably provided on the component press-bonding apparatus 10 side from the viewpoint of weight reduction of the protective sheet cassette 18.

The unit frame 66 rotatably supports a portion of the shaft 70 between the common feed roller 38 and the gear 64. Also, the unit frame 66 has engagement portions 74 integrally formed therein so as to be engaged with recessed slots 72 formed in the pair of side wall members 44 of the protective sheet cassette 18 shown in FIG. 1.

Figure 6:
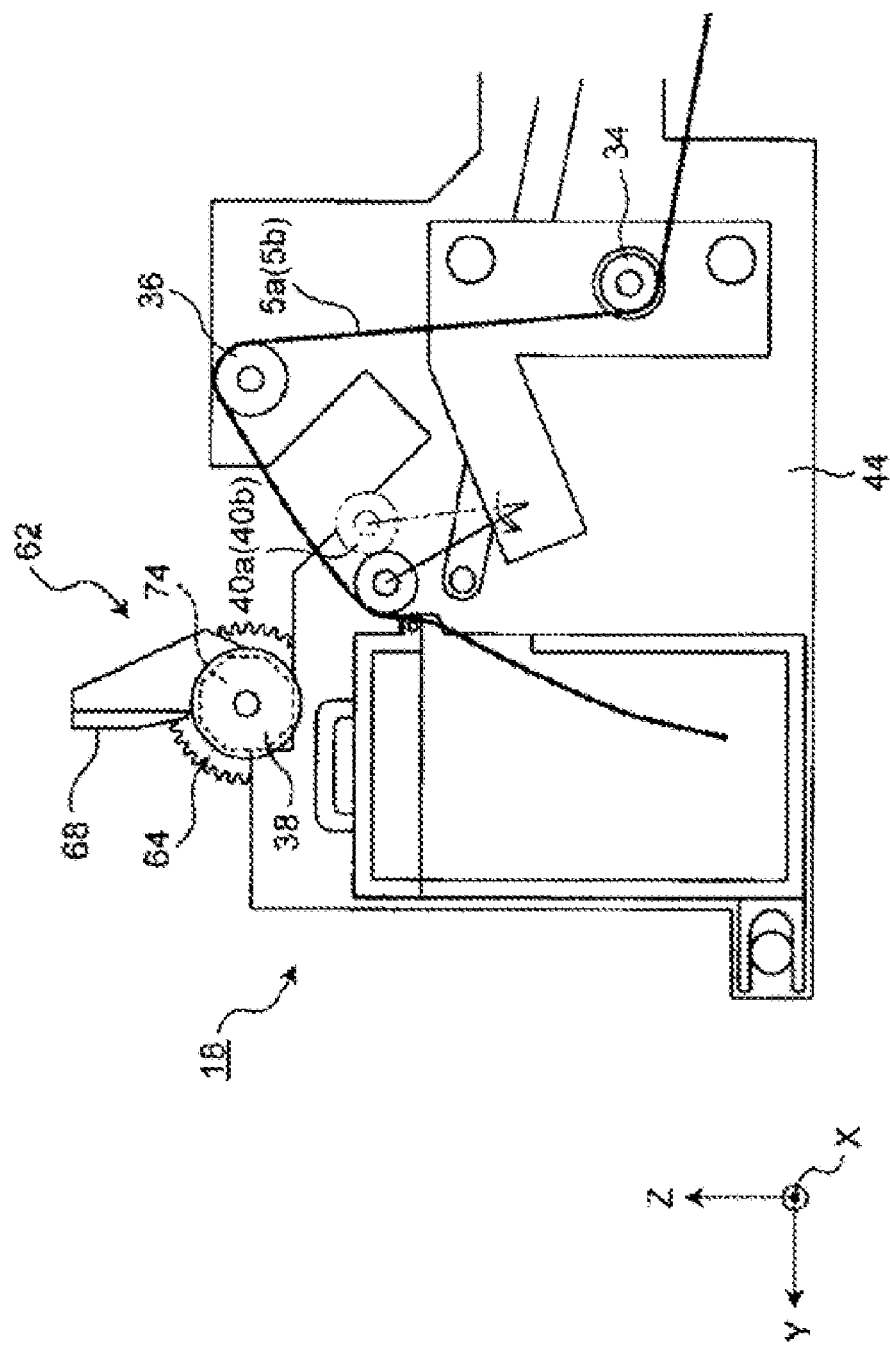
FIG. 6 is a partial side sectional view showing an aspect before the sheet driving unit shown in FIG. 4 is loaded (as viewed in the direction of arrow A in FIG. 1)

Each engagement portion 74 is formed into a polygonal shape (regular octagon in this embodiment) as its shape viewed in the X-axis direction, which is a longitudinal direction of the common feed roller 38, is shown in FIG. 6. Also, thickness of the engagement portion 74 in the X-axis direction is set slightly larger than thickness of the pair of side wall members 44 of the protective sheet cassette 18 supporting the engagement portions 74. Further, the engagement portion 74 is set smaller than a radial size of the gear 64.

By engagement of the engagement portions 74 described above with the recessed slots 72, the unit frame 66 supporting the common feed roller 38 (i.e., the sheet driving unit 62) is set in a stable posture onto the protective sheet cassette 18 (pair of side wall members 44). More specifically, the engagement portions 74 are engaged with the slots 72, by which the common feed roller 38 is positioned. Also, by the gear 64 positioned outside the pair of side wall members 44, the unit frame 66 having the engagement portions 74 engaged with the slots 72 is restricted in its movement in the X-axis direction.

In addition, since the engagement portions 74 are polygonal shaped, the sheet driving unit 62 can be placed in a stable posture that at least two side edges of the polygonal shape of the engagement portions 74 are supported on portions of the side wall members 44 of the protective sheet cassette 18 other than the slots 72 as shown in FIG. 6.

As the sheet driving unit 62 is fitted to the protective sheet cassette 18, the engagement portions 74 is engaged with the slots 72 while at least two side edges or three edges of the polygonal shape of the engagement portions 74 are supported by the slots 72. The common feed roller 38 is placed between the roller 36 and the pinch rollers 40a, 40b as shown in FIG. 2. In other words, in order to make this implementable, the slots 72 are formed in the pair of side wall members 44 of the protective sheet cassette 18.

The unit frame 66 also has an entrainment-preventing member 68. This entrainment-preventing member 68, as shown in FIG. 4, is a plate-shaped member extending in a longitudinal direction of the common feed roller 38 (in the X-axis direction) along an outer peripheral surface of the common feed roller 38. A distance between the common feed roller 38 and the entrainment-preventing member 68 is set to a clearance that prevents the entrainment of the protective sheets Sa, Sb (e.g., to 0.2-1 mm).

For more specific explanation with reference to FIG. 2, this entrainment-preventing member 68 enables and performs guiding of the protective sheets Sa, Sb, which have come out from between the common feed roller 38 and the pinch rollers 40a, 40b, not to the counter-recovery box 22 side but to the recovery box 22 side.

The pinch roller 40a is incorporated into a pinch roller unit 80a, as shown in FIG. 2. The pinch roller unit 80a has a pair of side wall members 82a. The pair of side wall members 82a, which are plate-shaped members, support the pinch roller 40a therebetween. More strictly, a pair of arms 84a support both ends of the pinch roller 40a by their free ends, and counter-free ends of the pair of arms 84a are swingably supported by the pair of side wall members 82a, respectively. Also, the pair of arms 84a, which are enabled to switch swinging direction to the common feed roller 38 side or the recovery box 22 side, are biased by springs (not shown) and thereby swung to either one of the swinging directions. As the swinging direction is switched to the common feed roller 38 side, the pair of arms 84a are swung to the common feed roller 38 side, and the pinch roller 40a presses the protective sheet Sa against the common feed roller 38. Then, the pinch roller 40a and the common feed roller 38 pinch the protective sheet Sa. On the other hand, as the swinging direction is switched to the recovery box 22 side, the pair of arms 84a are swung to the recovery box 22 side, and the pinch roller 40a goes separate from the common feed roller 38.

Similarly, the pinch roller 40b is incorporated into a pinch roller unit 80b. The pinch roller unit 80b has a pair of side wall members 82b. The pair of side wall members 82b, which are plate-shaped members, support the pinch roller 40b therebetween. More strictly, a pair of arms 84b support both ends of the pinch roller 40b by their free ends, and counter-free ends of the pair of arms 84b are swingably supported by the pair of side wall members 82b, respectively. Also, the pair of arms 84b, which are enabled to switch swinging direction to the common feed roller 38 side or the recovery box 22 side, are biased by springs (not shown) and thereby swung to either one of the swinging directions. As the swinging direction is switched to the common feed roller 38 side, the pair of arms 84b are swung to the common feed roller 38 side, and the pinch roller 40b presses the protective sheet Sb against the common feed roller 38. Then, the pinch roller 40b and the common feed roller 38 pinch the protective sheet Sb. On the other hand, as the swinging direction is switched to the recovery box 22 side, the pair of arms 84b are swung to the recovery box 22 side, and the pinch roller 40b goes separate from the common feed roller 38.

These pinch roller units 80a, 80b are supported by the pair of side wall members 44 of the protective sheet cassette 18 so as to be movable in the X-axis direction. More specifically, the pinch roller units 80a, 80b are supported by a plurality of guide rods 86 extending in the X-axis direction and having both ends supported by the pair of side wall members 44. The plurality of guide rods 86, which extend through a pair of side wall members 82a, 82b of the pinch roller units 80a, 80b, guide the pair of side wall members 82a, 82b movably in the X-axis direction.

By the pinch roller units 80a, 80b as described above, the pinch rollers 40a, 40b can be changed in their positions in the X-axis direction. As a result, when X-axis direction positions of the reel units 50a, 50b are changed, i.e., when X-axis direction positions of the protective sheets Sa, Sb are changed, the pinch rollers 40a, 40b are enabled to press the protective sheets Sa, Sb against the common feed roller 38 in correspondence to the X-axis direction positions of the protective sheets Sa, Sb, respectively.

Here are explained reasons that the plurality of protective sheets Sa, Sb are pressed against the common feed roller 38 not by the common pinch roller but by the pinch rollers 40a, 40b that are provided in correspondence to the protective sheets Sa, Sb, respectively.

In component press-bonding apparatuses using a plurality of protective sheets, as in this embodiment, sags (sagging quantities) occurring to a plurality of protective sheets, respectively, differ from sheet to sheet.

For adjustment of sags, a pinch roller corresponding to a protective sheet that is to be adjusted for its sag is separated off from the common feed roller, and next, work for pulling up the protective sheet toward the recovery box side or work for pulling back the protective sheet toward the feed reel side is performed. Then, the protective sheet with which adjustment of sagging has been completed is pinched by the pinch roller and the common feed roller. Thus, the adjustment of sagging of the protective sheet is completed.

In a case where the pinch roller is a common pinch roller, it is difficult to adjust sags of a plurality of protective sheets, respectively, by pulling up or pulling back the plurality of protective sheets while maintaining the common pinch roller separate from the common feed roller. The reason of this is that the protective sheets cannot be kept pinched by the common pinch roller and the common feed roller until the adjustment of sags of all the plurality of protective sheets is completed. Further, in a case where the pinch roller is a common pinch roller, a clearance may be generated between the common pinch roller and the common feed roller due to a sagging of the rollers themselves, so that there may occur variations in the pinching of the plurality of protective sheets by the two rollers, making it difficult to achieve the keeping of proper sagging quantities of protective sheets as well as proper sheet feed operations.

As a countermeasure for this, not a common pinch roller but pinch rollers corresponding to the individual protective sheets are provided respectively. Thus, a plurality of protective sheets can be adjusted for their sags one by one.

Figure 7:
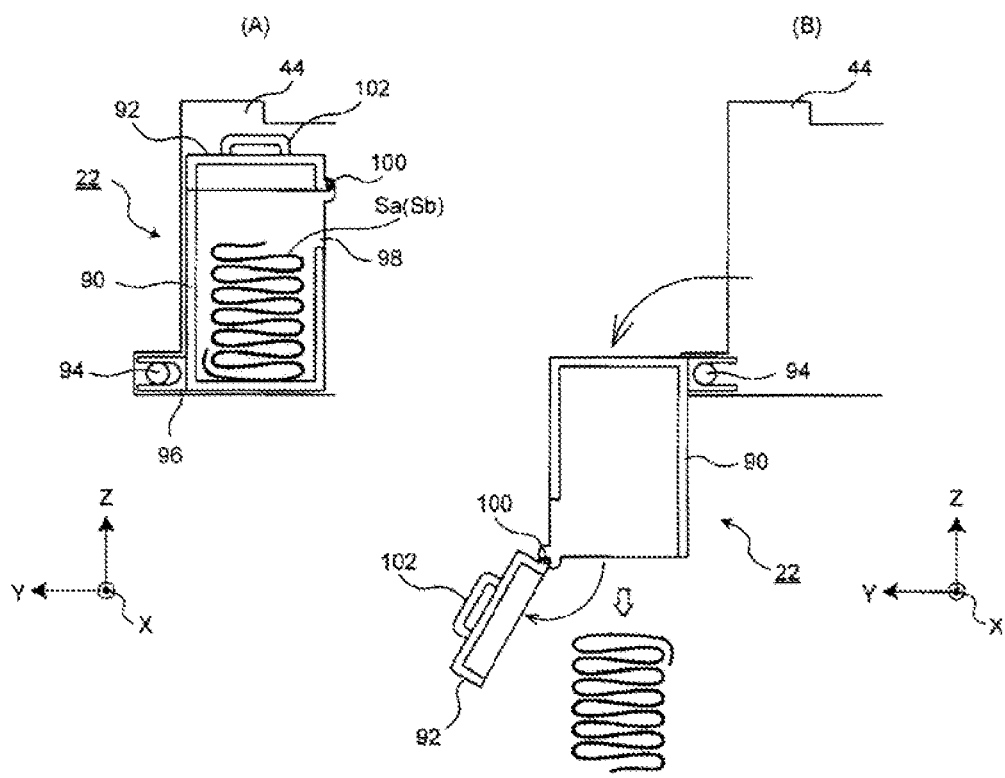
FIG. 7 is a partial side sectional view showing a recovery box of the component press-bonding apparatus according to an embodiment of the invention (as viewed in the direction of arrow A in FIG. 1)

The recovery box 22, which is a common box for recovering the plurality of protective sheets Sa, Sb as shown in FIG. 7, is rotatably supported by the protective sheet cassette 18 (a pair of side wall members 44). The recovery box 22 has a main casing 90 for housing a plurality of protective sheets Sa, Sb, a cover 92 of the main casing 90, a cylindrical-shaped support portion 94 formed in the pair of side wall members 44, and an engagement portion 96 to be engaged slidably and rotatably in the Y-axis direction.

The main casing 90 of the recovery box 22 has an opening 98 which faces the common feed roller 38 and through which a plurality of protective sheets Sa, Sb fed to the common feed roller 38 pass. The main casing 90 also has, above the opening 98, a hinge 100 coupled to the cover 92. The cover 92 has a handle 102 in its upper part. The engagement portion 96 is formed in a lower portion of the main casing 90 on the counter-opening 98 side.

With the recovery box 22 as described above, as the handle 102 is pulled up toward the front side (left side in the figure) in the Y-axis direction, the recovery box 22 is rotated about a support portion 94 of the protective sheet cassette 18, so that the cover 92 goes separate from the main casing 90 (see FIG. 7(B)). As a result, the plurality of protective sheets Sa, Sb are thrown downward from the main casing 90, for example, into a disposal box or recycling box (not shown). That is, the protective sheets Sa, Sb recovered to the recovery box 22 can be thrown away simply without contact by hand.

In addition, the main casing 90 of the recovery box 22 may include two housing spaces juxtaposed in the X-axis direction so as to house the protective sheets Sa, Sb, which are juxtaposed in the X-axis direction, individually and respectively. In this case, since the plurality of protective sheets are housed individually and separately, the plurality of protective sheets can be recovered securely without entangling, make it easier to do recycling or other recovery work. However, since a wall for division into two housing spaces needs to be provided, the recovery box 22 becomes smaller in housing quantity of protective sheets and complicated in its structure.

Hereinafter, operations and work in association with the protective sheet cassette 18 will be explained.

As shown in FIG. 2, the panel W on which a plurality of components Pa, Pb are placed (temporarily press-bonded) is placed on the table 14, the piston rods 60 of a pair of cylinders 58 shown in FIG. 3 go ahead to press a pair of swinging levers 42 downward, causing the guide rollers 30, 32 to move down. As a result, the protective sheet Sa approaches the component Pa while the protective sheet Sb approaches the component Pb.

The press-bonding tools 12a, 12b press-bond (finally press-bond) the components Pa, Pb to the panel W via the protective sheets Sa, Sb, and after the press-bonding, withdraw upward. Subsequently, the piston rods 60 of the cylinders 58 move backward, and the swinging levers 42 are swung upward by the springs 56. As a result, the guide rollers 30, 32 are moved up, so that the protective sheets Sa, Sb are separated away from the components Pa, Pb. Thereafter, the panel W, on which the plurality of components Pa, Pb have been press-bonded, is removed from on the table 14.

When the press-bonding of a plurality of components Pa, Pb onto the panel W has been done once or some plural times, i.e., when portions of the protective sheets Sa, Sb positioned below the press-bonding tools 12a, 12b have been contaminated to a specified level or more, the common feed roller 38 is rotated to a specified extent, for example, via a motor or other drive source. As a result, the whole protective sheets Sa, Sb are moved from the feed reels 20a, 20b toward the recovery box 22. Then, non-contaminated portions of the protective sheets Sa, Sb are placed below the press-bonding tools 12a, 12b.

Next, setting work of the protective sheets Sa, Sb to their paths is explained. For the setting work of the protective sheets, first, the swinging direction is switched so that the pinch rollers 40a, 40b are swung toward the recovery box 22 side, and the sheet driving unit 62 is removed from the protective sheet cassette 18. Next, empty feed reels 20a, 20b set in the reel units 50a, 50b are replaced with feed reels 20a, 20b on which protective sheets Sa, Sb are wound enough. Then, the protective sheet Sa is pulled out from the feed reel 20a, and the pulled-out protective sheet Sa is stretched successively over the guide roller 24a, the tension roller 26a, the guide roller 28a, the guide roller 30, the guide roller 32, the guide roller 34, the guide roller 36 and the pinch roller 40a. Similarly, the protective sheet Sb is pulled out from the feed reel 20b, and the pulled-out protective sheet Sb is stretched successively over the guide roller 24b, the tension roller 26b, the guide roller 28b, the guide roller 30, the guide roller 32, the guide roller 34, the guide roller 36 and the pinch roller 40b.

When the stretching of the plurality of protective sheets Sa, Sb onto the plurality of rollers except the common feed roller 38 is completed (see FIG. 6), the sheet driving unit 62 is fitted to the protective sheet cassette 18 (see FIG. 2). In this operation, the common feed roller 38 of the sheet driving unit 62 is placed between the guide roller 36 and the pinch rollers 40a, 40b while kept in contact with the protective sheets Sa, Sb.

When the fitting of the sheet driving unit 62 to the protective sheet cassette 18 is completed (i.e., when the engagement portions 74 of the sheet driving unit 62 are positioned on the deepest side of the recessed slots 72), the pinch rollers 40a, 40b are switched in their swinging direction so as to swing toward the common feed roller 38 side as shown in FIG. 2. By the pinch rollers 40a, 40b, the common feed roller 38 is biased so as to be pushed in toward the deepest side of the slots 72. The plurality of protective sheets Sa, Sb are each stretched over the common feed roller 38 so as to be pinched individually between the common feed roller 38 and their respective pinch rollers 40a, 40b.

In addition, depth of the slots 72 that determines the position of the common feed roller 38 is preferably set to such a depth that the protective sheets Sa, Sb are allowed to pass largely through between the guide roller 36 and the pinch rollers 40a, 40b so as to increase the contact area between the common feed roller 38 and the protective sheets Sa, Sb. As a result of an increased contact area with the protective sheets Sa, Sb, the common feed roller 38 is enabled to securely give a larger driving force to the protective sheets Sa, Sb. As a result also, the pinch rollers 40a, 40b are enabled to press the common feed roller 38 toward the bottom side of the slots 72. That is, the pinch rollers 40a, 40b are enabled to function as stoppers for preventing the sheet driving unit 62 from loosening off from the protective sheet cassette 18.

As shown above, only one process of work that the sheet driving unit 62 is fitted to the protective sheet cassette 18 allows the plurality of protective sheets Sa, Sb to be fixed to their respective paths simultaneously. The time required for the setting work of the protective sheets is shortened, as compared with cases in which the plurality of protective sheets Sa, Sb are fed to their corresponding press-bonding tools 12a, 12b, respectively, not by the common feed roller 38 but by different feed rollers.

According to this embodiment, the protective sheet Sa is effectively used for the press-bonding tool 12a while the protective sheet Sb is effectively used for the press-bonding tool 12b. Also, only changing the X-axis direction positions of the press-bonding tools 12a, 12b, the reel units 50a, 50b and the pinch roller units 80a, 80b allows the conveyance paths of the protective sheets Sa, Sb to be changed in correspondence to changes in the X-axis direction positions of a plurality of components Pa, Pb placed on the panel W. Further, since the common feed roller 38 for feeding the protective sheets Sa, Sb is removably fitted to the protective sheet cassette 18, the protective sheets Sa, Sb can be fitted to their conveyance paths with simplicity, as compared with cases in which the common feed roller 38 is not removably fitted. Furthermore, since the feed roller for feeding the protective sheets Sa, Sb is provided not as different ones but as a common feed roller 38 for common use, the setting time of the protective sheets Sa, Sb to their paths is shortened to more extent.

Next, a description is given for guide members which are applicable to the component press-bonding apparatus 10 of the above-described embodiment and which serve for positioning a plurality of protective sheets with respect to their widthwise direction (X-axis direction in the above-described embodiment) and for accurately guiding those protective sheets to below their corresponding press-bonding tools, respectively. These guide members make it possible to accurately feed a plurality of protective sheets to their corresponding press-bonding tools (to above corresponding components), respectively.

For example, the guide members are made up by a pair of plate-shaped members such as a pair of side wall members of the reel unit 50a (50b) shown in FIG. 2. That is, these guide members pinch the protective sheet in the X-axis direction to do the positioning and guiding in the X-axis direction.

Also, the guide members are made movable in a paralleled direction of a plurality of press-bonding tools (X-axis direction in the case of the above embodiment). For example, as the reel unit 50a (50b) is movably supported by a plurality of guide rods 54 having both ends supported by a pair of side wall members 44 of the protective sheet cassette 18, so the guide members are supported so as to be movable in the paralleled direction of a plurality of press-bonding tools by a plurality of guide rods extending through the guide members. As a result of this, when the plurality of press-bonding tools are changed in their paralleled direction, the guide members can guide the plurality of protective sheets toward positions below their corresponding press-bonding tools, respectively.

In addition, the pair of side wall member 52a (52b) of the reel unit 50a (50b) shown in FIG. 2 may also be assigned as the guide member.

Although a single (one-type) protective sheet is placed between one press-bonding tool and its corresponding one component in the component press-bonding apparatus 10 of the above-described embodiment, yet it is also allowable that a plurality (plural types) of protective sheets are placed so as to be stacked in the press-bonding direction.

As in the component press-bonding apparatus described in Patent Literature 1, at least one or more types of protective sheets may be placed between a press-bonding tool and a corresponding component. For example, a silicon-made cushion sheet, a Teflon (trademark) sheet, a polyimide sheet or the like may be placed other than the protective sheets of the above embodiment.

Figure 8:
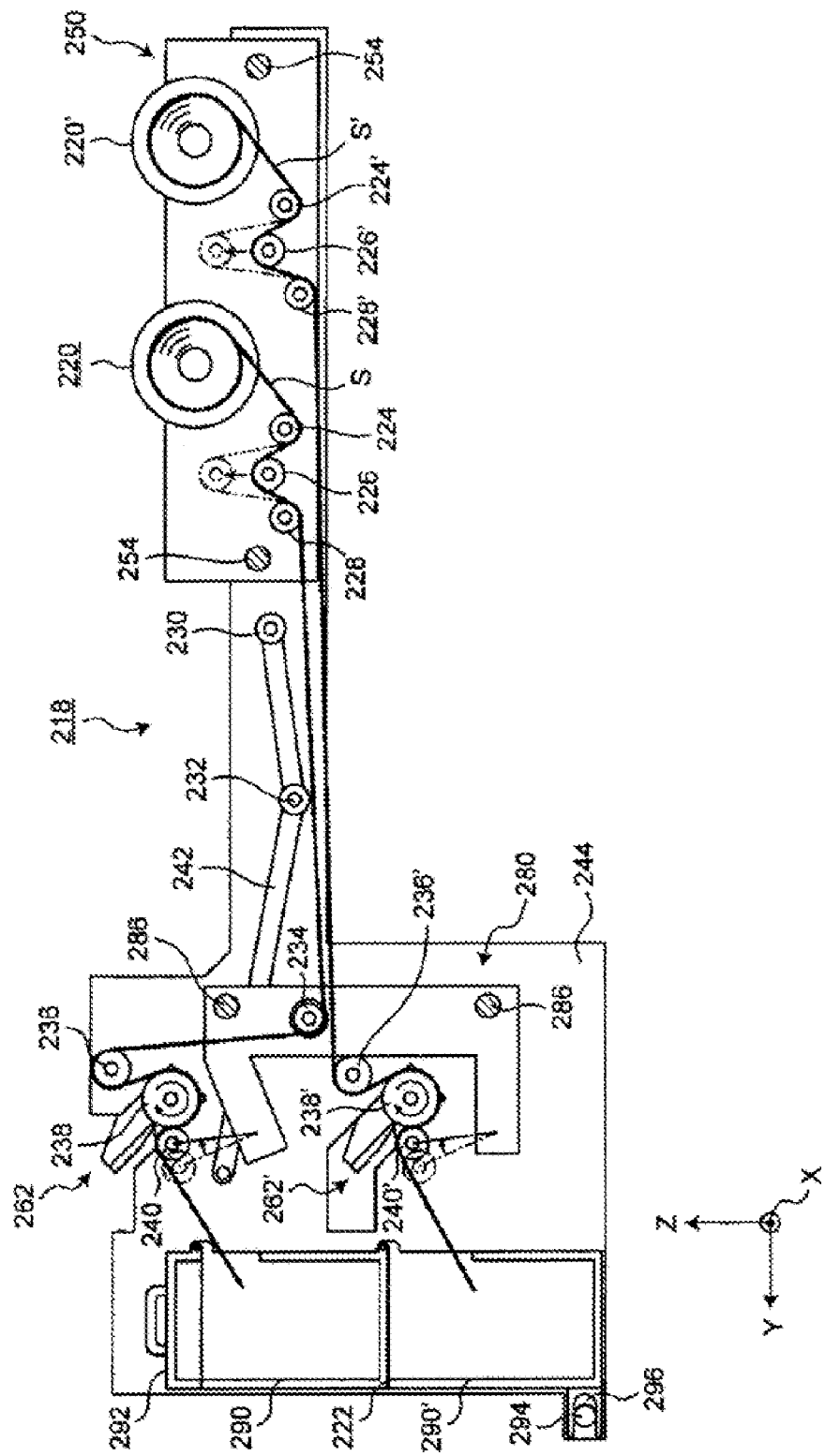
FIG. 8 is a side sectional view of a component press-bonding apparatus according to another embodiment of the invention (as viewed in the direction of arrow A in FIG. 1)

As an example, a component press-bonding apparatus in which at least one or more types of protective sheets can be placed between a press-bonding tool and its corresponding component is shown in FIG. 8.

Herein, the terms "at least one or more types" do not imply a lamination that the plurality of protective sheets to be placed between a press-bonding tool and a component are all different in type from one another. Also, the terms include a case in which one protective sheet is placed between a press-bonding tool and its corresponding component.

The component press-bonding apparatus, more strictly a protective sheet cassette 218, shown in FIG. 8, unlike the protective sheet cassette 18 shown in FIG. 2, is so structured that plural different types S, S' of protective sheets can be placed between the press-bonding tool and the component so as to be stacked in the pressing direction of the press-bonding tool (in the Z-axis direction).

It is noted that the number of protective sheets of each type in use is equal to the number of components to be press-bonded to the panel (at least one protective sheet of the same type is provided in parallel in the X-axis direction), as in the component press-bonding apparatus 10 shown in FIG. 1. Constituent elements shown in FIG. 8 are similar in function to those of FIG. 2 designated by reference numerals resulting from subtracting 200 from the reference numerals of FIG. 2. Accordingly, such constituent elements are omitted in description. Besides, constituent elements whose reference numerals include a mark of ' (single quotation) are those of a protective sheet of type S'.

As shown in FIG. 8, the protective sheet cassette 218 is so structured that with a protective sheets of type S stacked on a protective sheets of type S', protective sheets for the types S, S' are placed between the press-bonding tool and the component.

The protective sheet cassette 218 has, exclusively for the protective sheet of the type S, a plurality of feed reels 220, a plurality of guide rollers 224, a plurality of tension rollers 226, a plurality of guide rollers 228, a guide roller 234, a guide roller 236, a sheet driving unit 262, and a plurality of pinch rollers 240. Also, the protective sheet cassette 218 has, exclusively for the protective sheet of the type S', a plurality of feed reels 220', a plurality of guide rollers 224', a plurality of tension rollers 226', a plurality of guide rollers 228', a guide roller 236', a sheet driving unit 262', and a plurality of pinch rollers 240'.

Guide rollers 230, 232 are used in common to a plurality of types S, S' of protective sheets. That is, those guide rollers 230, 232 are used in common to all protective sheets. As a swinging lever 242 swings, the two guide rollers 230, 232, having the protective sheets of the types S, S' stacked thereon, make those protective sheets approach the components.

The feed reels 220, 220', the guide rollers 224, 224', the tension rollers 226, 226', and the guide rollers 228, 228' corresponding to one identical press-bonding tool constitute a reel unit 250. The reel unit 250 is supported by a plurality of guide rods 254 so as to be movable in the paralleled direction (X-axis direction) of a plurality of press-bonding tools.

The sheet driving unit 262 for the protective sheet of the type S, and the sheet driving unit 262' for protective sheets of the type S' are independent units, which are placed so as to be juxtaposed in an up/down direction (Z-axis direction) in the protective sheet cassette 218. In other words, a common feed roller 238 for the protective sheet of the type S and a common feed roller 238' for the protective sheet of the type S' are not incorporated in one unit. This is because the protective sheet of the type S and the protective sheet of the type S' differ in length of the conveyance direction and/or in frequency of use from each other. That is, the protective sheet of the type S and the protective sheet of the type S' differ run-out timing from each other, thus differing in timing of setting of new protective sheets between the types S, S'.

The pinch rollers 240, 240' corresponding to one identical press-bonding tool constitute a pinch roller unit 280. The pinch roller unit 280 is supported by a guide rod 286 so as to be movable in the paralleled direction (X-axis direction) of a plurality of press-bonding tools.

A recovery box unit 222 is so structured as to classify and recover a plurality of types S, S' of protective sheets.

Figure 9:
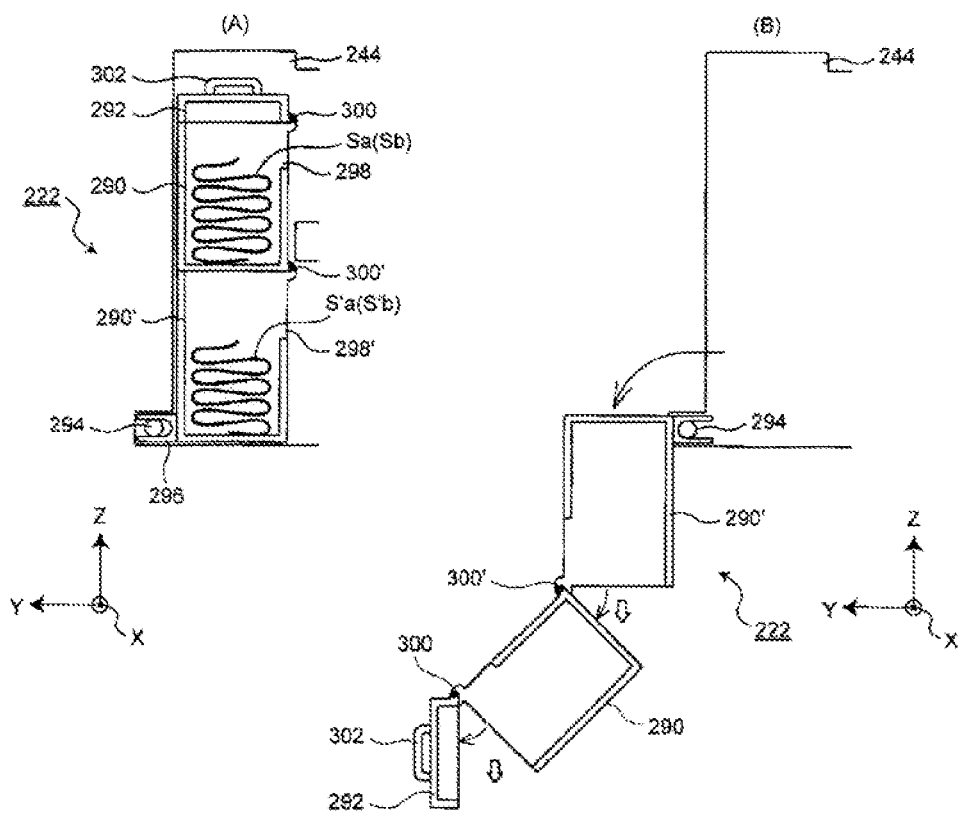
FIG. 9 is a partial side sectional view showing a recovery box of the component press-bonding apparatus according to the another embodiment of the invention.

The recovery box unit 222, as shown in FIG. 9, has an upper main casing 290 for housing protective sheets of the type S, a lower main casing 290' for housing protective sheets of the type S', a cover 292, an engagement portion 296 to be slidably and removably engaged with a cylindrical-shaped support portion 294 formed in a pair of side wall members 244 of the protective sheet cassette 218 so as to be ready for a plurality of types S, S' of protective sheets stacked and placed between a press-bonding tool and its corresponding component.

The upper main casing 290 of the recovery box unit 222 has an opening 298 which faces the common feed roller 238 and through which the protective sheet of the type S fed to the common feed roller 238 passes. The upper main casing 290 also has, above the opening 298, a hinge 300 coupled to the cover 292.

The lower main casing 290' has an opening 298' which faces the common feed roller 238' and through which the protective sheet of the type S' fed to the common feed roller 238' passes. The lower main casing 290' also has, above the opening 298', a hinge 300' coupled to the upper main casing 290. The upper main casing 290 serves as a cover of the lower main casing 290'.

The cover 292 has a handle 302 in its upper part. The engagement portion 296 is formed in a lower portion of the lower main casing 290' on the counter-opening 298' side.

With the recovery box unit 222 as described above, as the handle 302 is pulled up toward the front side (left side in the figure) in the Y-axis direction, the recovery box unit 222 is slid in the Y-axis direction and the recovery box unit 222 is rotated about a center of the support portion 294 of the protective sheet cassette 218, so that the cover 292 goes separate from the upper main casing 290 and the upper main casing 290 goes separate from the lower main casing 290' (see FIG. 9(B)). As a result, the protective sheet of the type S is thrown downward from the upper main casing 290 while the protective sheet of the type S' is thrown downward from the lower main casing 290'. In this operation, given that a recycling box (not shown) for the protective sheet of the type S and a recycling box (not shown) for the protective sheet of the type S' are set up below the recovery box unit 222, the recovered protective sheets of the types S, S' can be classified and disposed simply without contact by hand, and thereafter recycled.

In addition, in a case where a plurality of press-bonding tools are arrayed in the X-axis direction, the upper main casing 290 of the recovery box unit 222, like the main casing 90 of the recovery box 22, may include a plurality of housing spaces arrayed in the X-axis direction, for example, so as to house the plurality of protective sheets of the type S corresponding to the individual press-bonding tools, individually and respectively.

Similarly, the lower main casing 290' of the recovery box unit 222 also may include a plurality of housing spaces arrayed in the X-axis direction, for example, so as to house the plurality of protective sheets of the type S' arrayed in parallel in the X-axis direction, individually and respectively.

According to the embodiment of the component press-bonding apparatus in which article itself protective sheets of at least one or more types are stacked and placed between a press-bonding tool and its corresponding component as shown in FIG. 8, the protective sheet of the type S is used effectively for protection of a corresponding press-bonding tool while the protective sheet of the type S' also is used effectively for protection of a corresponding press-bonding tool. Also, only changing X-axis direction positions of the reel unit 250 and the pinch roller unit 280 allows the conveyance paths of the protective sheets Sa, Sb to be changed in correspondence to the changes in the X-axis direction positions of the components Pa, Pb placed on the panel W. Moreover, in a case where a plurality of press-bonding tools are arrayed in the X-axis direction, i.e. longitudinal direction, of the side edge portions of the panel W, since the common feed roller 238 for feeding the protective sheet of the type S and the common feed roller 238' for feeding the protective sheet of the type S' to their respective press-bonding tools are removably fitted to the protective sheet cassette 218, the individual protective sheets of the types S, S' can be fitted simply to their corresponding conveyance paths, as compared with cases where the common feed rollers 238, 238' are not removably fitted. Moreover, not that individual feed rollers are provided in correspondence to a plurality of types S of protective sheet arrayed in parallel in the X-axis direction, respectively, but that one common feed roller 238 for simultaneously feeding a plurality of types S of protective sheets is provided. Therefore, the time required for setting the plurality of types S of protective sheets to their corresponding paths is shortened to more extent. Further, similarly, the time required for setting a plurality of types S' of protective sheets to their corresponding paths is shortened to more extent by one common feed roller 238'.

Although the present invention has been fully described in connection with the preferred embodiments thereof with reference to the accompanying drawings, it is to be noted that various changes and modifications are apparent to those skilled in the art. Such Changes and modifications are to be understood as included within the scope of the present invention as defined by the appended claims unless they depart therefrom.

The entire disclosure of Japanese Patent Application No. 2009-277679 filed on Dec. 7, 2009, including specification, claims, drawings, and summary are incorporated herein by reference in its entirety.

Industrial Applicability

The present invention is not limited to cases in which a plurality of component press-bonding sites are arrayed in side edge portions of a panel in the longitudinal direction of the side edge portions. In this invention, a plurality of protective sheets in a state of being arrayed in parallel in a specified direction (X-axis direction in the above-described embodiment) are moved in directions orthogonal to the specified direction. Therefore, the invention can be fulfilled only if a plurality of component press-bonding sites differ in positions in the specified direction from one another. Also, the invention is practicable even if one component is press-bonded to the panel, of course. Accordingly, the invention can preferably be used in fields in which at least one component is press-bonded to a panel by a press-bonding tool, and/or fields in which one protective sheet is placed or a plurality of protective sheets are stacked and placed between one press-bonding tool and a component to be press-bonded to the panel by the one press-bonding tool.

The invention claimed is:

1. A component press-bonding apparatus including a press-bonding tool for press-bonding components, which are placed on a panel so as to be arrayed in a first direction, to the panel via a sheet, wherein
the component press-bonding apparatus has a sheet conveyance unit comprising:
a plurality of feed reels which are arrayed in the first direction and which feed a plurality of sheets in a second direction orthogonal to a press-bonding direction of the press-bonding tool and the first direction;
a plurality of path members which form, in parallel with the first direction, a plurality of sheet paths extending in the second direction that is a direction extending from the individual feed reels and passing through above their corresponding components; and
a common feed roller which is driven and rotated in a state of being in contact with the plurality of sheets on the plurality of sheet paths arrayed in the first direction, whereby the common feed roller feeds the plurality of sheets simultaneously in the second direction along the individual sheet paths so as to make the sheets pass from the individual feed reels through above the components, and wherein
the plurality of feed reels and path members are movable in the first direction so that placement of the plurality of sheet paths arrayed in parallel in the first direction can be changed in the first direction in correspondence to positions above the components arrayed in the first direction, and
the common feed roller is removably fitted to the sheet conveyance unit so as to go separate from the sheets.

2. The component press-bonding apparatus according to claim 1, wherein each of the path members has a pinch roller which can bias the sheet toward the common feed roller and go separate from the common feed roller.

3. The component press-bonding apparatus according to claim 1, further comprising:
a drive source for rotating the common feed roller, wherein when the common feed roller is fitted to the sheet conveyance unit, the drive source is coupled to the common feed roller.

4. The component press-bonding apparatus according to claim 1, wherein
each of the path members has two rollers for supporting its corresponding sheet on one surface of the sheet,
the common feed roller, when fitted to the sheet conveyance unit, is placed by being moved between the two rollers of each path member while keeping in contact with the other surface of the sheet.

5. The component press-bonding apparatus according to claim 1, further comprising a sheet driving unit which includes the common feed roller and an entrainment-preventing member for preventing entrainment of the sheet to the feed roller and which is removably fitted to the sheet conveyance unit.

6. The component press-bonding apparatus according to claim 1, further comprising a plurality of guide members which serve for positioning and guiding a plurality of sheets moved from the plurality of feed reels in the first direction and which are movable in the first direction.

7. The component press-bonding apparatus according to claim 1, further comprising:
a contact member which extends in the first direction so as to be contactable with a plurality of sheets; and
a swinging lever which swings on a center of a pivot extending in the first direction and supports the contact member by its free end, and which, by swinging, makes each sheet approach a component via the contact member.

8. The component press-bonding apparatus according to claim 1, further comprising:
sheet conveyance units provided for individual types of sheets so that a plurality of sheets of at least one type can be placed between the press-bonding tool and a component in a state of being stacked in the press-bonding direction; and
a sheet recovery box which has at least one or more housing spaces enabled to independently house a plurality of sheets of at least one type having passed through between the press-bonding tool and the component and which is rotatably supported by the sheet conveyance unit, wherein
the sheet recovery box is enabled to, when rotating, dispose the sheets housed in the individual housing spaces simultaneously.

9. A component press-bonding method in which components placed on a panel so as to be arrayed in a first direction are press-bonded to the panel by a press-bonding tool via a sheet, the method comprising:
arraying and preparing a plurality of feed reels in the first direction, the feed reels serving for feeding sheets along sheet paths extending in a second direction orthogonal to a component press-bonding direction of the press-bonding tool as well as to the first direction;
aligning the sheet paths and the above-component positions, respectively, by moving the individual feed reels in the first direction so that the plurality of sheet paths extending from the feed reels in the second direction pass through above the corresponding components, respectively;
driving and rotating a common feed roller in a state that the plurality of sheets on the plurality of sheet paths arrayed in the first direction are kept in contact with the common feed roller, so that the sheets of the individual feed reels are fed simultaneously in the second direction so as to make the sheets pass through positions above their corresponding aligned components, wherein
the common feed roller is removably fitted to the support member that supports the common feed roller so as to go separate from the sheets.

* * * * *